United States Patent
Liu et al.

(10) Patent No.: US 6,329,277 B1
(45) Date of Patent: Dec. 11, 2001

(54) METHOD OF FORMING COBALT SILICIDE

(75) Inventors: Bill Yowjuang Liu, San Jose, CA (US); Paul R. Besser, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/417,839

(22) Filed: Oct. 14, 1999

(51) Int. Cl.⁷ .................................................. H01L 21/44
(52) U.S. Cl. ............................ 438/612; 438/638; 438/607
(58) Field of Search .................................... 438/612, 655, 438/664, 660, 649, 651, 682, 607, 683, 685, 653

(56) References Cited

U.S. PATENT DOCUMENTS 4,566,026   1/1986   Lee et al. .
5,047,367 * 9/1991   Wei et al. ............................. 438/607

* cited by examiner

Primary Examiner—Olik Chaudhuri
Assistant Examiner—Theresa T Doan

(57) ABSTRACT

A semiconductor arrangement and method of forming silicide regions includes conformally depositing a reducing material layer on a silicon substrate. A refractory metal layer is then conformally deposited on the reducing material layer. Annealing is then performed to form a refractory metal silicide layer on the silicon substrate. The metal silicide layer is a cobalt silicide and the reducing material layer includes at least one of tantalum, magnesium, aluminum or calcium. The reducing material reduces native oxide on a silicon substrate to allow the cobalt silicide to form.

9 Claims, 3 Drawing Sheets

METHOD OF FORMING COBALT SILICIDE

FIELD OF THE INVENTION

This invention relates to the field of semiconductor devices, and more specifically, to a process designed to form cobalt silicide layer ($CoSi_2$) for use in self aligned silicide technology.

BACKGROUND OF THE INVENTION

In the manufacture of semiconductor devices, silicides, materials formed by the reaction of a refractory metal or a near-noble metal with silicon, are used in a variety of applications. For example, these materials may be used as a contact via fill material, or as a device structure such as a floating gate or a local interconnect.

It is normally necessary to make contact to device regions underlying a dielectric on the surface of the silicon substrate. This is accomplished by first forming an opening or via (contact via) in the dielectric over the region to be contacted, and next filling the contact via with a conductive material.

After the contact vias have been filled with a conductive material, it is then necessary to electrically connect certain device regions with others, as well as to provide for electrical connection to external leads. These requirements are met by forming a wiring layer on the surface of the substrate. The wiring layer is formed by depositing a conductive layer that is in direct contact with the contact fills previously formed. The conductive layer is then masked and etched to leave continuous lines of the conductive material necessary to make the appropriate connections to the device regions of the substrate underlying the contact fill. These lines are known as interconnects.

Several conductive materials can be used as a contact via fill. In larger geometry devices, aluminum (Al) is deposited on the entire substrate, including over the vias. The areas over the vias and interconnects are then masked with photoresist and the aluminum is etched from the remaining areas, leaving the vias filled with aluminum as well as forming interconnects on the surface of the dielectric layer.

In smaller geometry devices, those one micron or less, aluminum has proven to be inadequate as a fill due to problems such as poor step coverage and poor contact integrity. For these devices, silicides of refractory or near-noble metals, such as titanium or cobalt, are used as the initial fill material filling the lower portion of the via in contact with the substrate. The metal is first deposited followed by an anneal to form the silicide on the substrate in the regions exposed by the via. The non-silicidized metal remaining on the dielectric surface is then selectively etched. Because the silicide is formed only on those regions where there is silicon exposed, that is, the active device regions, and the remaining metal can be selectively etched without a masking step, the structure formed by this process is self aligned. This process is an example of self aligned silicide technology ("salicide technology").

After the silicide formation in the lower portion of the via is completed, it is then necessary to fill the unfilled upper portion of the via with aluminum or another conductive material and to form interconnects as described above. However, if aluminum is deposited directly on silicide, the aluminum frequently will diffuse through the silicide into the underlying active device region of the substrate, causing device failure. This phenomenon is known as spiking. To prevent spiking it is necessary in the prior art techniques described above to form a diffusion barrier prior to aluminum deposition. This is accomplished by first depositing an additional dielectric layer. That deposition is followed by masking and etching steps to remove the dielectric from the via regions. A thin layer of titanium, titanium nitride or titanium tungsten is formed to act as a diffusion barrier. The aluminum is then deposited, masked and etched from unmasked portions along with the aluminum. See for example U.S. Pat. No. 4,566,026 where titanium tungsten nitride/titanium nitride bilayer is used as a diffusion barrier against spiking.

Another alternative is to form the silicide as described above, and next grow a selective tungsten layer to fill the via. However, selective tungsten deposition generally leads to degradation of the junction integrity and unacceptably high specific contact resistivity.

Alternatively, in the prior art, after the self aligned silicide formation described above, a doped selective silicon layer is grown on top of the silicide layer to completely fill the via. Selective silicon has improved junction integrity, that is, good diode I-V characteristics such as low reverse bias leakage current and a good ideality factor. A problem with this method is that during drive-in and subsequent high temperature steps, excessive dopant from the selective silicon layer may diffuse into the active regions and change the device performance characteristics. Additionally, in CMOS devices, to prevent the formation of unintended p-n junctions it is necessary to first grow p-type selective silicon over the p-type regions keeping the n-type regions masked, and then grow n-type selective silicon over the n-type regions using an n-type dopant such as arsenic, phosphorous or antimony, keeping the p-type regions masked during this step.

In addition to via fill applications, the salicide technology described above can be used for forming other device regions. For example, the technology can be used to form a silicide on top of polysilicon to be used as a floating gate. Additionally, local interconnects can be formed using this technology after deposition, masking and etch of a polysilicon layer.

In the prior art, titanium silicide and cobalt silicide are the two most commonly used silicides for salicide technology. However, the formation of cobalt silicide is impeded by the presence of a native oxide on the substrate surface. This can be overcome by performing a high temperature heating on the substrate immediately before deposition, and then depositing the cobalt under ultra high vacuum. Such ultra high vacuum systems however are generally for use in research, but do not have the throughput capabilities needed for volume production.

What is needed is a manufacturable method of forming a high quality silicide compatible with the self aligned silicide technology described above.

SUMMARY OF THE INVENTION

This and other needs are met by the present invention which provides a method of forming silicide regions comprising the steps of conformally depositing on a silicon substrate a reducing material layer. A near-noble metal layer is conformally deposited on the reducing material layer. Annealing is then performed to form a near-noble metal silicon layer on the silicon substrate. The reducing material layer comprises at least one of tantalum, magnesium, aluminum or calcium.

By employing a thin film of material with a Gibbs free energy of oxide formation that is lower than silicon dioxide, any silicon dioxide remaining on the surface of the silicon substrate will be reduced. This allows the silicide, such as cobalt silicide, to form. Otherwise, where the silicon dioxide is present on the silicon substrate, the cobalt silicide will not form through the silicon dioxide. This is due to the high sensitivity cobalt exhibits to residual oxide.

The earlier stated needs are met by another embodiment of the present invention which provides a semiconductor arrangement having a silicon substrate and silicide regions on the silicon substrate. An oxide reducing material is present on the silicide regions. This oxide reducing material comprises at least one of tantalum, magnesium, aluminum or calcium.

The semiconductor arrangement of the present invention exhibits a more uniform silicide coverage, since an oxide reducing material is used to reduce any oxide present on the silicide regions. This allows the silicide process, especially when the silicide is a cobalt silicide, to have a greater processing latitude.

The foregoing and other features, aspects and advantages of the present invention will become more apparent from the following detailed description of the present invention when taken in conjunction with the accompanying drawings.

DETAILED DESCRIPTION OF THE PRESENT INVENTION

The present invention solves the problem of poor silicide formation on silicon substrates due to the presence of silicon dioxide on the silicon substrate. This is achieved by the present invention, in part, through the employment of a reducing material that serves to reduce the oxide present on the silicon substrate. The reducing material has a Gibbs free energy of oxide formation that is lower than the silicon dioxide present on the silicon substrate. By removing the silicon dioxide from the silicon substrate, the silicide, such as cobalt silicide, may more readily form.

Figure 1:
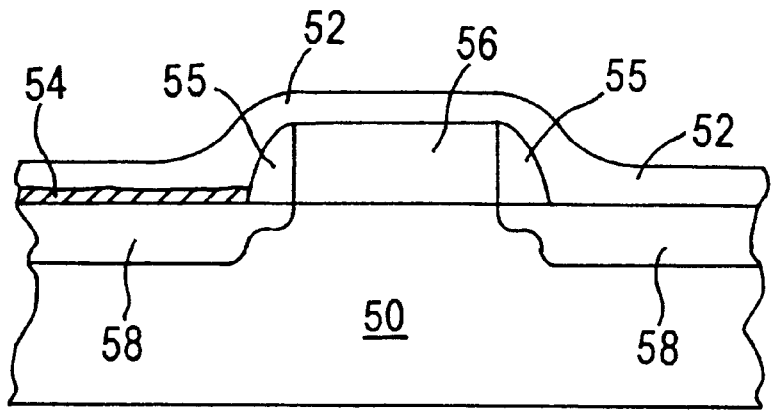
FIG. 1 is a cross-section of a portion of a semiconductor wafer during a stage of a silicidation process of the prior art.

FIG. 1 depicts a portion of a semiconductor wafer during one step of a silicidation process in accordance with the prior art. A silicon substrate 50 has active regions 58 formed therein. Gate 56 is formed over a gate oxide. Side wall spacer 55, made of a silicon oxide or silicon nitride, for example, are formed on the side walls of the polysilicon gate 56. A near-noble, refractory metal layer 52, formed of cobalt, for example, is conformally deposited over the silicon substrate 50 and the polysilicon gate 56. In this example, the silicon substrate 50 has an area of silicon dioxide 54 formed on the surface over one of the active regions 58. Such native oxides are difficult to prevent in semiconductor wafer production.

Figure 2:
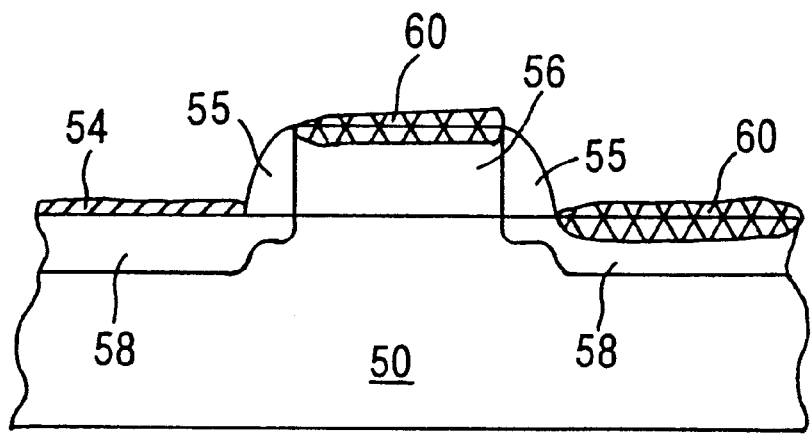
FIG. 2 depicts the portion of FIG. 1 after the silicidation is completed according to the prior art.

Following the deposition of the cobalt layer 52, the semiconductor wafer is subjected to an annealing process which causes the formation of high resistivity phase silicide regions (CoSi). The unreacted cobalt is then removed and a second annealing step, normally performed at a higher temperature than the first annealing step, is then performed to transform the high resistivity phase silicide regions into lower resistivity phase silicide regions (e.g. $CoSi_2$). However, cobalt is very sensitive to residual oxide and will not form the cobalt silicide through the silicon dioxide region 54. This is depicted in FIG. 2 in which the silicide regions 60 are properly formed over the polysilicon gate 56 and one of the active regions 58 that did not originally have the silicon dioxide region 54 thereon. Over the silicon dioxide region 54 on the active region 58 on the left-hand side of FIG. 2, silicide has not been formed due to the sensitivity of cobalt to the residual oxide.

The present invention allows for a greater process latitude by reducing the native oxide formed on the active regions in the silicon substrate. This is accomplished by depositing a thin layer of a reducing material under the cobalt layer prior to annealing.

Figure 3:
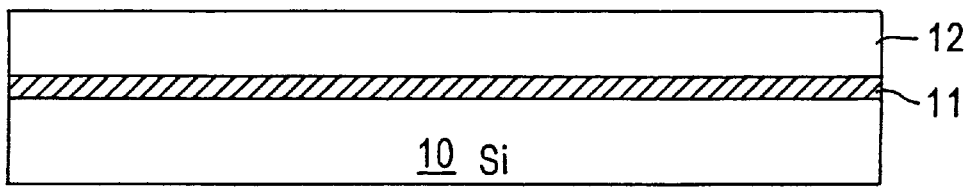
FIG. 3 is a cross-sectional elevation view of the silicon substrate with a reducing material layer and a cobalt layer formed in accordance with the present invention.

FIG. 3 shows the surface of a silicon substrate 10 after deposition of a reducing material layer 11 and a near-noble refractory metal layer 12. In the currently preferred embodiments, the reducing material layer 11 is made of one of tantalum, magnesium, aluminum or calcium. The selection of these metals is based upon Ellingham diagrams, and have a Gibbs free energy of oxide formation that is lower than silicon dioxide. Hence, these metals will reduce the silicon dioxide and allow the cobalt silicide to form. The use of titanium was suggested in U.S. Pat. No. 5,047,367—Wei et al. Other metals suggested in the U.S. Pat. No. 5,047,367 for the reducing material were zirconium, hafnium, or vanadium. The refractory metal 12 is made of cobalt in preferred embodiments. The reducing material layer 11 has a thickness of between about 20 and about 200 Angstroms. An especially preferred thickness for the reducing material layer 11is approximately 40 Angstroms. For a refractory metal layer 12 made of cobalt, for example, the deposited thickness is between about 80 and about 150 Angstroms, with an especially preferred thickness being about 120 Angstroms.

Following the deposition of the reducing material layer 11 and the near-noble metal layer 12, annealing steps are performed to form the silicide. Annealing can take place in two steps, with an etch step included between the two anneals to remove unreacted metal. The substrates are annealed, in preferred embodiments in a rapid thermal anneal processing system, for approximately 15 to approximately 90 seconds at approximately 475° C. to approximately 700° C. for the first anneal and for 15 to 90 seconds at approximately 750° C. to 850° C. for the second anneal.

As can be seen from FIG. 3, the reducing material layer 11 is in direct contact with the silicon substrate 10 after the deposition. During the initial stages of the anneal, the reducing material layer 11 is responsible for removing any native oxide ($SiO_2$) on the surface of the silicon substrate 10. Based on Ellingham diagrams, metals with a Gibbs free energy of oxide formation that is lower than silicon dioxide will reduce the silicon dioxide. Examples of these metals include magnesium, tantalum, aluminum and calcium.

The oxide formed with the reducing material in layer 11 travels to the surface along with the unreacted reducing material, where the oxygen is released to the ambient. The cobalt silicide is eventually completely silicidized to $CoSi_2$ and remains at the surface of the silicon substrate 10.

Figure 4:
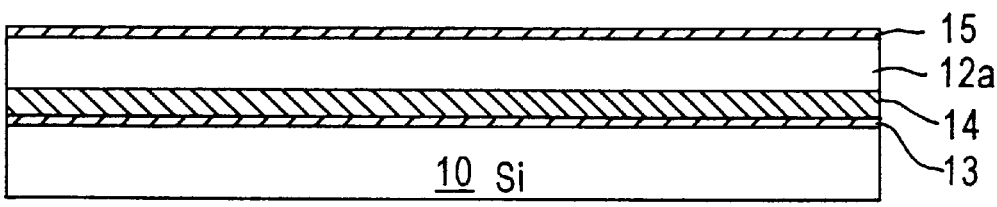
FIG. 4 is a cross-sectional view of the semiconductor body of FIG. 3 after an anneal has proceeded for a short period of time.

FIG. 4 shows the structure of the deposited layers after the anneal has proceeded for a short period of time. Some of the reducing material from the reducing material layer 11 of FIG. 3 has diffused up through the refractory metal (cobalt) layer 12 to form a reducing material layer 15 at the upper surface of the structure, deposited on the cobalt layer 12a, which is now slightly thinner than the cobalt layer 12 of FIG. 3, due to downward diffusion of cobalt. Beneath cobalt layer 12a is layer 14, which is a mixture of the reducing material and the cobalt. Disposed beneath layer 14 is layer 13, which is the initial cobalt silicide layer formed from the reaction of the cobalt, which has diffused downward, and the silicon on the surface of silicon substrate 10. Initially, layer 13 is not completely silicided and is comprised of CoSi and $CoSi_2$.

Figure 5:
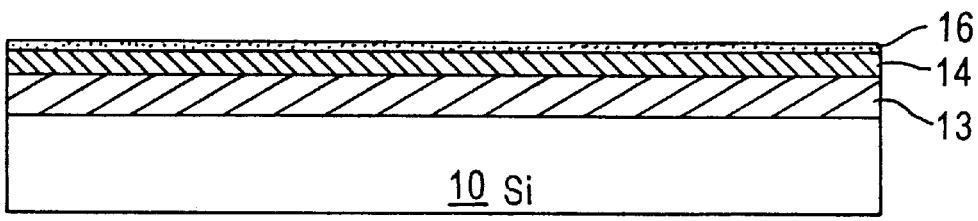
FIG. 5 is a cross-sectional elevation view of the semiconductor body of FIG. 2 at a later time during the anneal.

Referring to FIG. 5, the reducing material layer 15 from FIG. 4 has formed a surface layer 16 by the reaction of the reducing material with the ambient. The remaining cobalt from the cobalt layer 12a of FIG. 4 has now completely diffused downward into the layer 14, the mixture of the reducing material and cobalt, and into the cobalt silicide layer 13.

Figure 6:
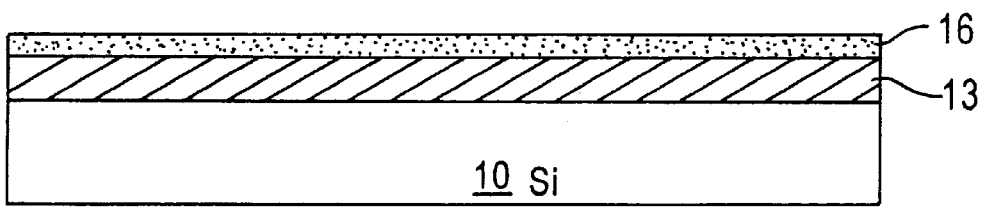
FIG. 6 is a cross-sectional elevation view of the semiconductor body of FIG. 5 after completion of the anneal.

FIG. 6 shows the bilayer after the anneal step is completed. The cobalt silicide ($CoSi_2$) layer 13 is disposed on the surface of silicon substrate 10. A reducing material layer 16 is disposed on top of the cobalt silicide layer 13. Since the reducing material layer 11 of FIG. 3 has cleaned the surface of silicon substrate 10 of all native oxide, the resulting cobalt silicide layer 13 of FIG. 6 is of very high quality. The cobalt silicide layer 13 formed by the present invention is useful in the formation of three-dimensional or vertical devices, as a selective epitaxial silicon layer can be grown on top of the cobalt silicide layer 13 of the present invention.

The present invention can be used in salicide technology, as described below with respect to FIGS. 7–9.

Figure 7:
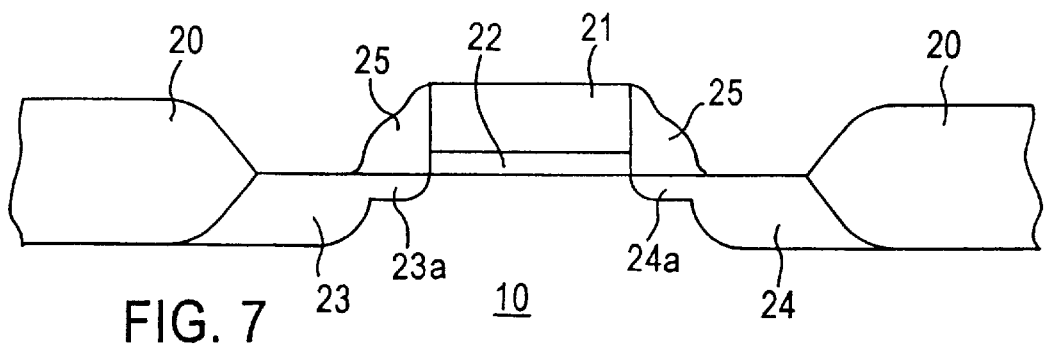
FIG. 7 is a cross-sectional elevation view of a metal oxide semiconductor device.

FIG. 7 shows a conventional MOS floating gate transistor on silicon substrate 10. The region labeled 20 is the field oxide made of silicon dioxide. Region 21 is made of polysilicon. The process of the present invention forms a floating gate from the polysilicon of region 21. Region 22 is the gate oxide, also made of $SiO_2$. Regions 23 and 24 are the source and drain regions, respectively, formed by doping the silicon substrate 10 in the regions indicated. If silicon substrate 10 is a p-type substrate, regions 23 and 24 will be doped n-type; conversely if silicon substrate 10 is an n-type substrate, regions 23 and 24 will be doped p-type. Most of regions 23 and 24 will be heavily doped, with the exception of regions 23a and 24a, which are lightly doped. Region 25 is a spacer. The spacer 25 can be made of $SiO_2$ or silicon nitride. The structure of FIG. 7 may be made by well-known prior art techniques.

Figure 8:
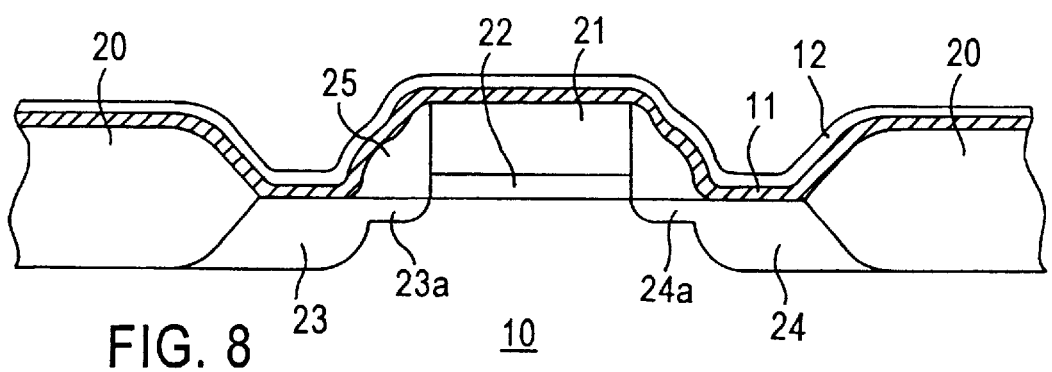
FIG. 8 is a cross-sectional elevation view of the semiconductor body of FIG. 7 after deposition of a reducing material layer and a cobalt layer.

FIG. 8 shows the structure of FIG. 7 after the deposition of the reducing material layer 11 and the cobalt layer 12, as described above. The structure of FIG. 8 will then be processed through a first anneal step, e.g. in a nitrogen or ammonia ambient, using the operating parameters described earlier.

After the first anneal, layers 11 and 12 will have formed an intermediate structure such as that shown in FIG. 5 in those regions where layers 11 and 12 overlie silicon, that is, over regions 23, 24 and 21 of FIG. 8. After the first anneal, the structure of FIG. 8 will then undergo a cobalt etch and reducing material etch. The cobalt etch can be performed, for example, in a mixture of nitric acid ($HNO_3$) and water ($H_2O$). The volume ratio of $HNO_3:H_2O$ is approximately 1:1.

The above etches are selective, so that they will remove all unreacted metal over the $SiO_2$ field oxide and the $SiO_2$ or $Si_3N_4$ spacers, but will not etch the intermediate silicide structure overlying the exposed silicon regions. These etches may be carried out before the complete formation of the reducing material/cobalt silicide bilayer of the present invention because if the anneal is carried out to completion before etching, silicon from the regions 21, 23 and 24 of FIG. 8 may diffuse both upwards and sideways from these regions into layers 11 and 12, leading to silicide formation both above the regions 21, 23, 24 where it is desired as well as above field oxide layer 20 and spacer 25 where it is not desired. Therefore, the parameters of the first anneal are selected to form a protective layer overlying the exposed silicide regions 21, 23 and 24, without causing sideways diffusion and silicidization of layers 11 and 12 in other regions.

The structure of FIG. 8, after first anneal and metal etches, will then undergo a second anneal in an ambient (e.g. nitrogen or ammonia) using the operating parameters stated earlier to form the cobalt silicide of the present invention. The resulting structure is shown in FIG. 9. The cobalt silicide layer 13 over regions 23 and 24 can be used as the initial fill for a contact fill.

Figure 9:
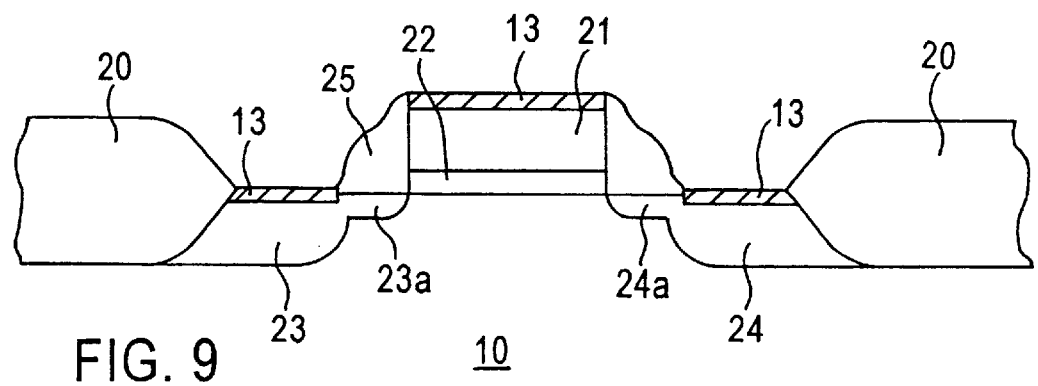
FIG. 9 is a cross-sectional elevation view of the semiconductor body of FIG. 8 after anneal.

The structure of FIG. 9 may be further processed in a conventional manner to connect the device to other devices in a circuit through deposition of a dielectric layer and formation of a contact or a local interconnect, as is well-known in the art. However, because of the use of a reducing material to remove native oxide on the silicon substrate, formation of a cobalt silicide over the desired regions is assured. This increases the process latitude of the silicidation process.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of forming silicide regions comprising:

conformally depositing on a silicon substrate a reducing material layer;

conformally depositing on the reducing material layer a refractory metal layer; and annealing to form a refractory metal silicide layer on the silicon substrate;

wherein the reducing material layer comprises at least one of magnesium, aluminum or calcium.

2. The method of claim 1, wherein the refractory metal silicide layer comprises cobalt silicide.

3. The method of claim 1, wherein the reducing material layer comprises a material with a Gibbs free energy of oxide formation that is lower than silicon dioxide.

4. The method of claim 1, wherein the annealing includes first and second annealing steps.

5. The method of claim 4, wherein the first annealing step forms a higher resistivity phase silicide and includes exposing the silicon substrate to a temperature of between about 475° C. and about 700° C.

6. The method of claim 5, wherein the first annealing step is performed for between about 15 and about 90 seconds.

7. The method of claim 6, wherein the second annealing step is performed after the first annealing step and forms a lower resistivity phase silicide and includes exposing the silicon substrate to a temperature of between about 750° C. and about 850° C.

8. The method of claim 7, wherein the second annealing step is performed for between about 15 and about 90 seconds.

9. The method of claim 1, wherein the reducing material layer is deposited to a thickness of between about 20 and about 200 Angstroms.

* * * * *